US007849240B2

United States Patent
Guan et al.

(10) Patent No.: US 7,849,240 B2
(45) Date of Patent: Dec. 7, 2010

(54) METHODS AND SYSTEMS OF SCANNING AN INPUT DEVICE HAVING MULTIPLE KEY SWITCHES

(75) Inventors: Hong Guan, Shenzhen (CN); Gaile Lin, Shenzhen (CN); Chuanting Xu, Yichang (CN); Guoquan Li, Sihui (CN)

(73) Assignee: Zoran Corporation, Sunnyvale, CA (US)

( * ) Notice: Subject to any disclaimer, the term of this patent is extended or adjusted under 35 U.S.C. 154(b) by 360 days.

(21) Appl. No.: 11/997,991

(22) PCT Filed: Sep. 29, 2007

(86) PCT No.: PCT/CN2007/002856

§ 371 (c)(1),
(2), (4) Date: Feb. 5, 2008

(87) PCT Pub. No.: WO2009/043197

PCT Pub. Date: Apr. 9, 2009

(65) Prior Publication Data

US 2009/0248925 A1    Oct. 1, 2009

(51) Int. Cl.
*G06F 13/12*    (2006.01)
(52) U.S. Cl. .................... 710/67; 710/66; 345/168
(58) Field of Classification Search .............. None
See application file for complete search history.

(56) References Cited

U.S. PATENT DOCUMENTS

| 4,395,704 | A | * | 7/1983 | Kishimoto et al. | ............ 341/22 |
| 4,408,184 | A | * | 10/1983 | Ishii | ............ 341/26 |
| 5,677,687 | A |   | 10/1997 | Valdenaire | ............ 341/26 |
| 5,831,556 | A | * | 11/1998 | Niot | ............ 341/26 |
| 2006/0066577 | A1 | * | 3/2006 | Barthelet et al. | ............ 345/168 |

FOREIGN PATENT DOCUMENTS

| CN | 1763700 | 4/2006 |
| KR | 20050054603 | 6/2005 |

OTHER PUBLICATIONS

Fitch et al., Method of Detecting and Debouncing Keyboard Switch Changes, Mar. 1, 1984, IBM TDB, pp. 1-3.*
International Search Report and Written Opinion for International Application No. PCT/CN2007/002856, Jul. 3, 2008.

* cited by examiner

*Primary Examiner*—Eron J Sorrell
(74) *Attorney, Agent, or Firm*—Morgan, Lewis & Bockius LLP

(57) ABSTRACT

A method of having multiple devices share a circuit's input/output (I/O) terminals includes applying first and second input signals to first and second I/O terminals to generate first and second output signals at the second and first I/O terminals, respectively. The first and second I/O terminals are coupled to first, second, and third devices via a plurality of signal paths. The method determines which, if any, of the first, second, and third devices is activated based on the first and second output signals. In some embodiments, the three devices correspond to three key switches of a keyboard through which a user can enter operation instructions. In some other embodiments, the three devices correspond to three signal receivers, which are controlled by a local or remote signal source that transmits activation signals in a wired or wireless manner.

33 Claims, 6 Drawing Sheets

METHODS AND SYSTEMS OF SCANNING AN INPUT DEVICE HAVING MULTIPLE KEY SWITCHES

FIELD OF THE INVENTION

The present invention relates generally to the field of sharing input/output terminals of an electronic module, and in particular to methods and systems of scanning a keyboard having multiple key switches coupled to the module.

BACKGROUND OF THE INVENTION

An electronic application is usually equipped with an input device, e.g., a keyboard including multiple key switches, for a user to enter operation-related instructions. These multiple key switches are coupled to the input/output (/I/O) terminals of an integrated circuit (IC) such as a key-scan sequencer in the electronic application in a predefined manner. The IC is configured to apply input signals to some I/O terminals and capture output signals at some other I/O terminals in accordance with a predefined key-scan process. From the captured output signals, the electronic application determines which, if any, of the multiple key switches is activated and performs operations accordingly.

A problem with many conventional key-scan sequencer designs and associated key-scan processes is the low ratio of key switches to I/O terminals. In other words, they require too many I/O terminals be dedicated to the scanning of key switches in order to uniquely identify each key switch activated by a user. As a result, the IC may have fewer I/O terminals available for other important or even mandatory functions, e.g., power supply, ground connection, and data transfer. One way of easing this problem is to increase the IC's total pin count and therefore the number of I/O terminals. But this approach inevitably increases the IC's packaging cost and may increase other device costs as well.

SUMMARY

In some embodiments, an input device comprises: first and second I/O terminals and a plurality of signal paths coupling the first I/O terminal to the second I/O terminal. The plurality of signal paths further comprise a first uni-directional signal path including a first device, a second uni-directional signal path including a second device, and a bi-directional signal path including a third device.

In some embodiments, an input device comprises: first, second, and third arrays of devices, multiple I/O terminals, including first and second I/O terminals, and multiple signal paths for coupling the three arrays of devices to the multiple I/O terminals. There are at least three signal paths between the first I/O terminal and the second I/O terminal, including a first uni-directional signal path including a first device of the first array of devices, a second uni-directional signal path including a second device of the second array of devices, and a bi-directional signal path including a third device of the third array of devices.

In some embodiments, a method of detecting user activations of devices comprises the operations of: applying a first input signal to a first I/O terminal, wherein the first I/O terminal is coupled to a second I/O terminal via a plurality of signal paths and the plurality of signal paths comprises a first uni-directional signal path including a first device, a second uni-directional signal path including a second device, and a bi-directional signal path including a third device; capturing a first output signal at the second I/O terminal in response to the first input signal at the first I/O terminal; applying a second input signal to the second I/O terminal; capturing a second output signal at the first I/O terminal in response to the second input signal at the second I/O terminal; and determining which one of the first, second, and third devices, if any, is activated based on the first and second output signals.

In some embodiments, a method of having multiple devices share a circuit's I/O terminals, comprises: applying first and second input signals to first and second I/O terminals to generate first and second output signals at the second and first I/O terminals, respectively, wherein the first and second I/O terminals are coupled to first, second, and third devices via a plurality of signal paths; and determining which, if any, of the first, second, and third devices is activated based on the first and second output signals.

BRIEF DESCRIPTION OF THE DRAWINGS

The aforementioned features and advantages of the invention as well as additional features and advantages thereof will be more clearly understood hereinafter as a result of a detailed description of preferred embodiments when taken in conjunction with the drawings.

Like reference numerals refer to corresponding parts throughout the several views of the drawings.

DESCRIPTION OF EMBODIMENTS

It would be desirable to have a key switch configuration that increases the ratio of key switches to I/O terminals and an associated key-scan process that can uniquely determine which key switch is activated in response to user selection of the key switches.

Reference will now be made in detail to embodiments, examples of which are illustrated in the accompanying drawings. In the following detailed description, numerous specific details are set forth in order to provide a thorough understanding of the subject matter presented herein. But it will be apparent to one of ordinary skill in the art that the subject matter may be practiced without these specific details. In other instances, well-known methods, procedures, components, and circuits have not been described in detail so as not to unnecessarily obscure aspects of the embodiments.

As noted in the background, many conventional key-scan processes have low ratios of key switches to I/O terminals. An electronic application employing these key-scan processes may have to adopt a higher pin count packaging scheme to perform predefined functions. Below are two examples of such key-scan processes.

Figure 1:
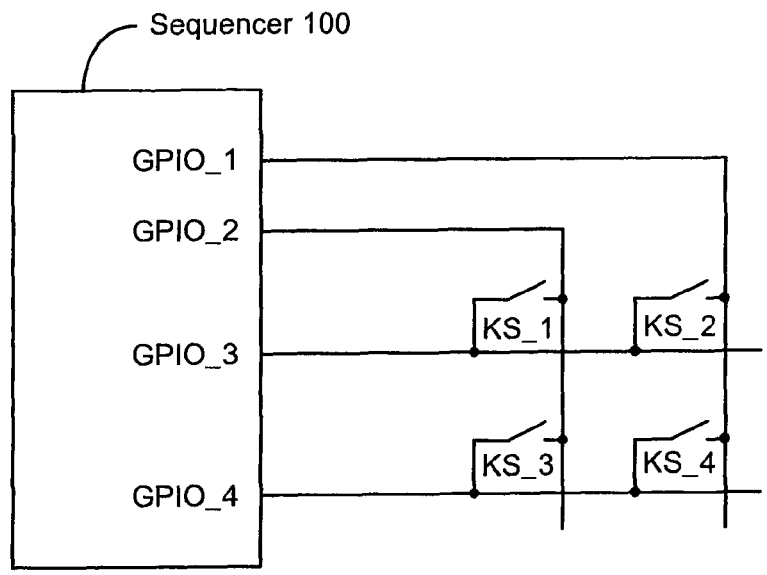
FIG. 1 is a block diagram of a prior art matrix configuration of an array of four key switches coupled to four I/O terminals of a key-scan sequencer.

FIG. 1 is a block diagram of a prior art matrix configuration of an array of four key switches coupled to four I/O terminals of a key-scan sequencer. The four key switches KS_1 to KS_4 are arranged into a 2×2 matrix, each key switch having two ends and each end coupled to one of the four I/O terminals GPIO_1 to GPIO_4. The ratio of key switches to I/O terminals is 1:1.

In some embodiments, the four I/O terminals by default all have a logic-high level, e.g., by coupling to a power supply through pull-up resistors (not shown in FIG. 1). At a predefined moment, the key-scan sequencer 100 applies a logic-low signal to the I/O terminal GPIO_2 and checks the output at the I/O terminal GPIO_3. The output has two possible outcomes: (i) a logic-low level if the key switch KS_1 is currently activated (e.g., depressed) by a user or (ii) a logic-high level if the key switch KS_1 is not activated. During a key-scan period, the key-scan sequencer 100 repeats the same test for each key switch in the matrix to determine its state. At the end of the procedure, zero or one user-activated key switch is identified and operations associated with the user-activated key switch, if any, are performed accordingly.

Figure 2:
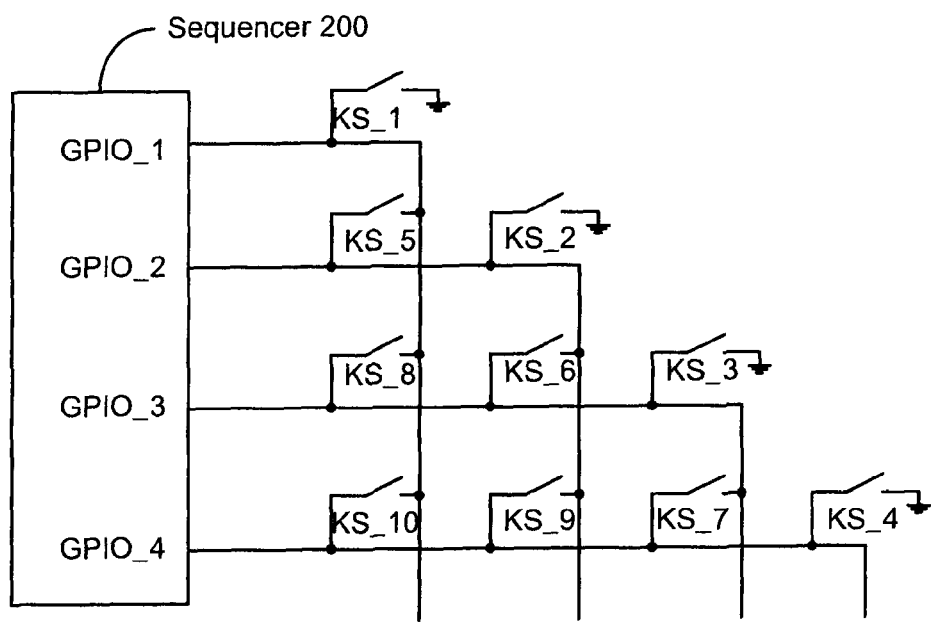
FIG. 2 is a block diagram of a prior art pyramid configuration of an array of 10 key switches coupled to four I/O terminals of a key-scan sequencer.

FIG. 2 is a block diagram of a prior art pyramid configuration of an array of 10 key switches coupled to four I/O terminals of a key-scan sequencer. The 10 key switches KS_1 to KS_10 occupy more than half of the positions of a 4×4 matrix. The four key switches KS_1 to KS_4 are deployed along the diagonal direction of the matrix and each of them has two ends, one coupled to an I/O terminal and the other to the ground. The six key switches KS_5 to KS_10 are located at the lower half of the matrix, each key switch having two ends and each end coupled to one of the four I/O terminals GPIO_1 to GPIO_4. The ratio of key switches to I/O terminals in FIG. 2 is 2.5:1, which is higher than the ratio associated with FIG. 1.

In some embodiments, the key-scan sequencer 200 employs two different types of key-scan operations, one applied to the four key switches KS_1 to KS_4 and the other to the six key switches KS_5 to KS_10. Assume that the four I/O terminals are at a logic-high level by default. At predefined moments of a key-scan period, the key-scan sequencer 200 examines the logic level at each of the four I/O terminals GPIO_1 to GPIO_4. A logic-low level at any I/O terminal corresponds to a user activation of one of the four key switches KS_1 to KS_4. At other predefined moments, the key-scanner sequencer 200 applies the procedure described above in connection with FIG. 1 to determine if any of the six key switches KS_5 to KS_10 is activated. The 10 key switches can be examined in any arbitrary sequence.

One feature shared by the two prior art configurations is that there is only one signal path between a pair of I/O terminals. The signal path is bi-directional and includes a key switch. For example, if a user depresses the key switch KS_8 in FIG. 2, the I/O terminal GPIO_1 is coupled to the I/O terminal GPIO_3 by the key switch KS_8. The current may flow along the signal path from the I/O terminal GPIO_1 to the I/O terminal GPIO_3 or in the opposite direction, depending on the relative voltages at the two I/O terminals. The aforementioned prior art key-scan process does not consider the current flow direction in a signal path when determining which key switch is activated because there is only one key switch along the signal path.

One aspect of the present invention is a key switch configuration in which there are multiple signal paths between a pair of first and second I/O terminals, including a bi-directional signal path like one described above, a first uni-directional signal path from the first I/O terminal to the second I/O terminal, and a second uni-directional signal path from the second I/O terminal to the first I/O terminal, and each signal path has one unique key switch. Consequently, the ratio of key switches to I/O terminals increases significantly.

Figure 3:
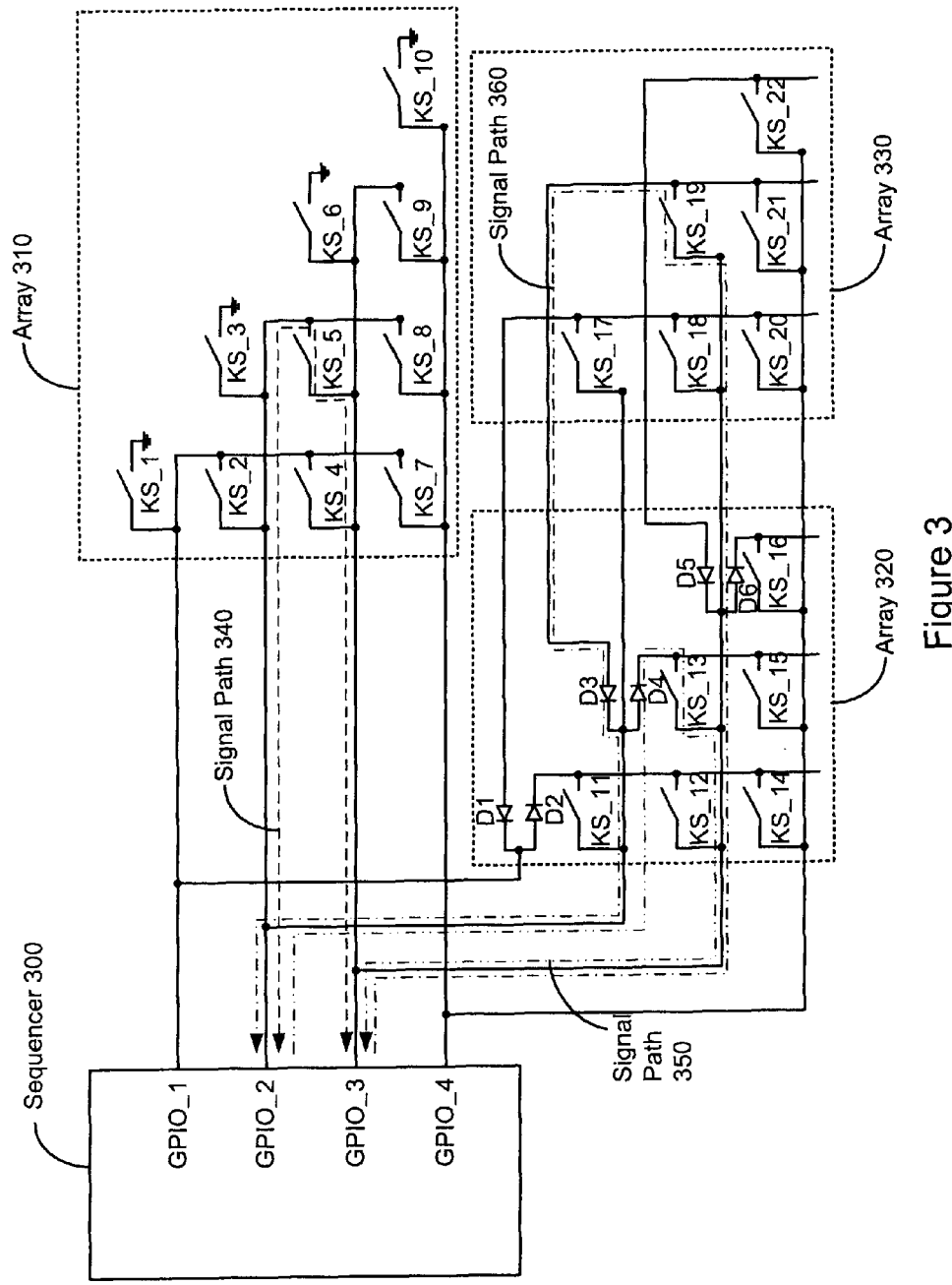
FIG. 3 is a block diagram of a key switch configuration of three arrays of 22 key switches coupled to four I/O terminals of a key-scan sequencer in accordance with some embodiments.

FIG. 3 is a block diagram of a key switch configuration of three arrays having a total of 22 key switches that are coupled to four I/O terminals of a key-scan sequencer in accordance with some embodiments. The 22 key switches are grouped into three arrays 310, 320, and 330, each array having a pyramid configuration. The 10 key switches in the array 310 are the same as the 10 key switches in FIG. 2. The other two arrays 320 and 330 each have six key switches and each key switch has two ends, one end directly coupled to one of the four I/O terminals and the other end connected to another one of the four I/O terminals through a diode. The ratio of key switches to I/O terminals in FIG. 3 increases to 5.5:1, significantly higher than that of the two prior art configurations shown in FIGS. 1 and 2, respectively.

There are three signal paths between each pair of I/O terminals of the key-scan sequencer 300 in FIG. 3. For example, there is a bi-directional signal path 340 between the I/O terminals GPIO_2 and GPIO_3 and this bi-directional signal path 340 includes the key switch KS_5 in the array 310. Bi-directional signal path 340 allows current flow either from GPIO_2 to GPIO_3 or from GPIO_3 to GPIO_4 when the key switch KS_5 is activated. The exact current flow direction depends on the relative voltages at the two I/O terminals at the moment when the key switch is depressed.

There are two uni-directional signal paths 350, 360 between the two I/O terminals. The uni-directional signal path 350 includes a diode D4 and a key switch KS_13. The anode of the diode D4 is coupled to the I/O terminal GPIO_2, and therefore uni-directional signal path 350 can only have current flow from GPIO_2 to GPIO_3. Further, current can flow from GPIO_2 to GPIO_3 only if the I/O terminal GPIO_3 is set to a logic-low level and the key switch KS_13 is depressed.

The uni-directional signal path 360 includes a diode D3 and a key switch KS_19. The cathode of the diode D3 is coupled to the I/O terminal GPIO_2, and therefore uni-directional signal path 360 can only have current flow from GPIO_3 to GPIO_2. Further, current can flow from GPIO_3 to GPIO_2 if the I/O terminal GPIO_2 is set to a logic-low level and the key switch KS_19 is depressed.

For illustrative purposes, a key switch configuration and associated key-scan process involving one pair of I/O terminals are described below in connection with FIGS. 4A-4B and 5.

Figure 4A:
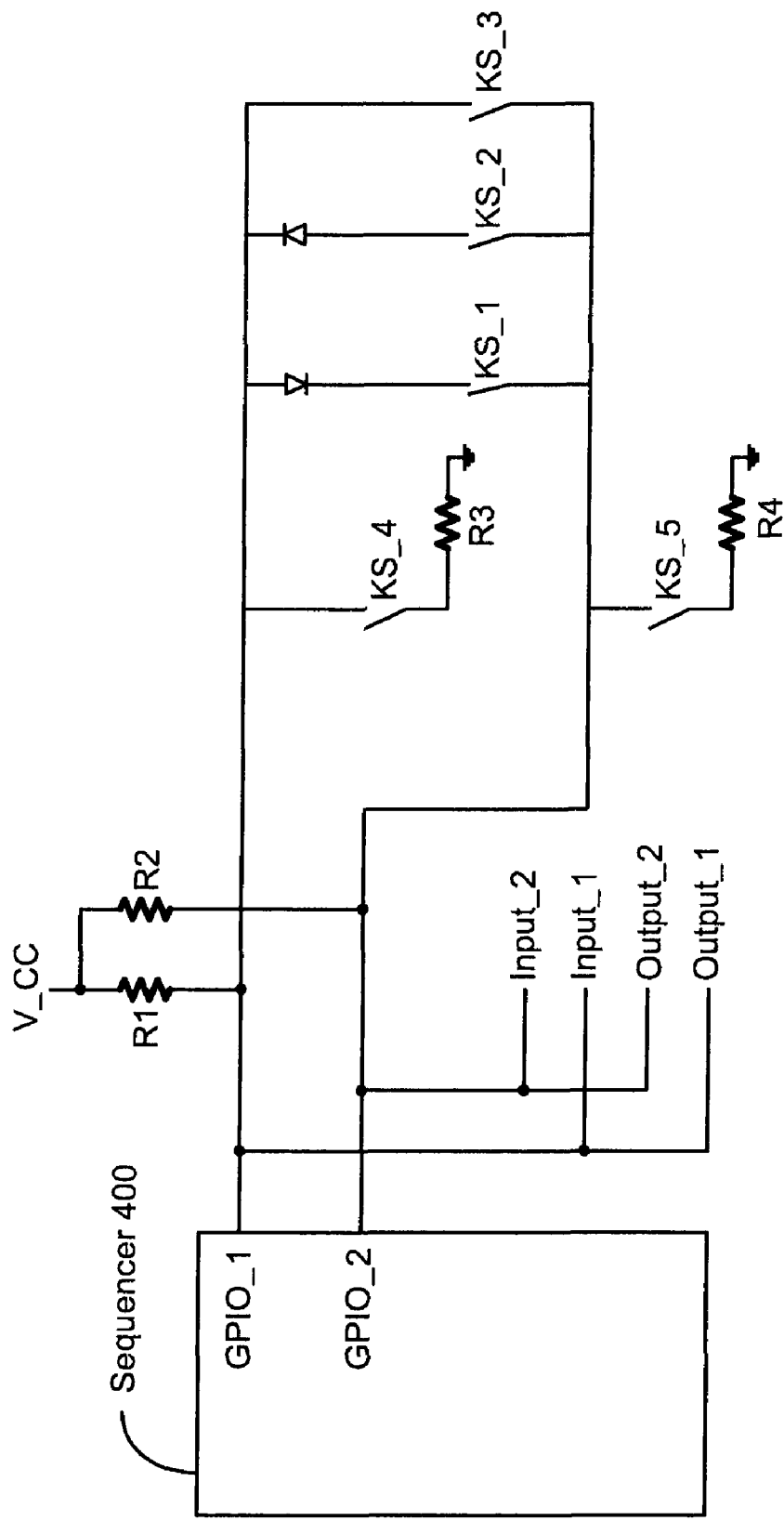
FIG. 4A is a block diagram of a key switch configuration of five key switches coupled to two I/O terminals of a key-scan sequencer in accordance with some embodiments.
Figure 4B:
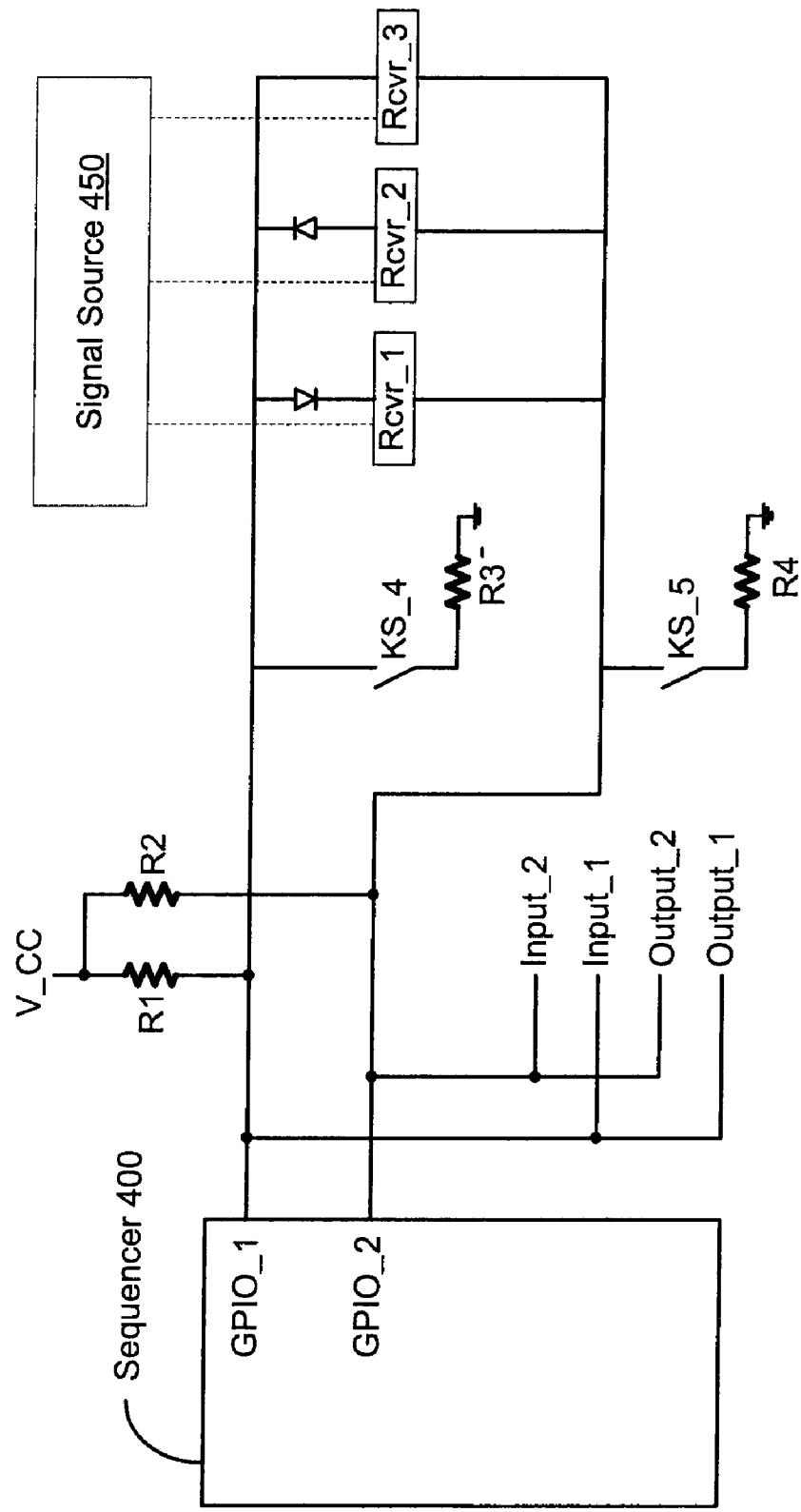
FIG. 4B is a block diagram of an alternative configuration of two key switches and three signal receivers coupled to two I/O terminals of a key-scan sequencer in accordance with some embodiments.

FIG. 4A is a block diagram of a key switch configuration of five key switches coupled to two I/O terminals of a key-scan sequencer in accordance with some embodiments. There are three signal paths between the I/O terminals GPIO_1 and GPIO_2: (i) the first uni-directional signal path from GPIO_1 to GPIO_2 that includes the first key switch KS_1, (ii) the second uni-directional signal path from GPIO_2 to GPIO_1 that includes the second key switch KS_2, and (iii) the bi-directional signal path between GPIO_1 and GPIO_2 that includes the third key switch KS_3. The two I/O terminals GPIO_1 and GPIO_2 are each coupled to a power supply V_CC through a respective pull-up resistor R1, R2. If no key switch is activated, the two I/O terminals are, by default, at a logic-high level. Each of the two I/O terminals GPIO_1 and GPIO_2 can be grounded through a respective pull-down resistor R3 or R4 and a respective key switch KS_4 or KS_5.

In some embodiments, one or two of the key switches KS_4 and KS_5 are replaced with one or two of input channels (Input_1, Input_2) and/or one or two of output channels (Output_1, Output_2). As will be described below, the sequencer 400 treats input/output channels in a way similar to its treatment of a key switch.

In some embodiments, at least some of the key switches in FIG. 4A are replaced with other devices that generate logic signals. FIG. 4B is a block diagram of an alternative configuration of two key switches and three signal receivers that are coupled to two I/O terminals of a key-scan sequencer in accordance with some embodiments. The three signal receivers Rcvr_1, Rcvr_2, Rcvr_3 each replace one of the key switches KS_1, KS_2, KS_3. Activation logic signals are transmitted from a signal source 450 (which may be internal or external to the device that includes the sequencer 400) to the three signal receivers in a wired or wireless manner. The sequencer 400 scans the receivers to determine which of the receivers, if any, is activated and then acts accordingly. In some embodiments, the sequencer 400 repeatedly scans the receivers to detect a sequence of values, or a multi-bit value, from the signal source 450. One exemplary signal source 450 is radio-frequency identification (RFID) tag and the corresponding signal receivers are exemplary RFID readers. Another exemplary signal source 450 is a multi-function wired or wireless remote control configured to adjust the audio and/or video characteristics of a head-mounted apparatus, such as a head-mounted display or a virtual reality headset. In this case the signal receivers are Bluetooth, Wi-Fi or infrared processing modules.

Figure 5:
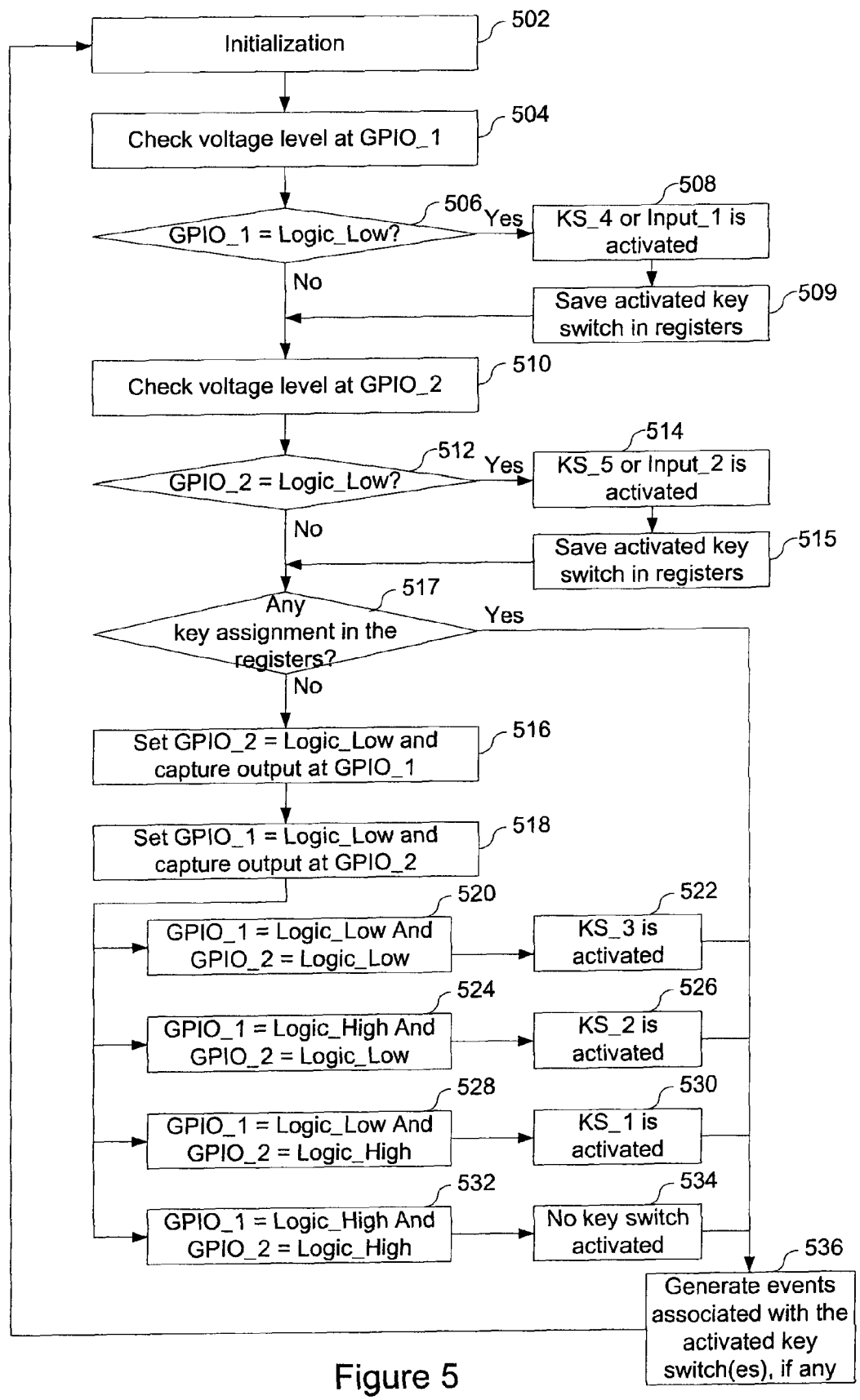
FIG. 5 is a flow chart of a multi-phase key-scan process as applied to the key switch configuration of FIG. 4A in accordance with some embodiments.

FIG. 5 is a flow chart of a multi-phase key-scan process (also called a method) as applied to the key switch configuration of FIG. 4A in accordance with some embodiments. Note that this process is applicable to configurations that include devices other than or in addition to key switches, such as the configuration shown in FIG. 4B.

The process has at least two phases. During the first phase, the sequencer 400 determines whether or not one subset of the five key switches is activated by a single operation. During the second phase, the sequencer 400 performs operations to determine whether or not another subset of the five key switches is activated.

At the beginning of a key-scan cycle, the key-scan sequencer 400 is initialized (502). In some embodiments, the initialization includes storing the current values at the I/O terminals GPIO_1 and GPIO_2 in registers or memory locations. After initialization, the sequencer 400 checks the voltage level at the I/O terminal GPIO_1 (504). If I/O terminal GPIO_1 has a logic-low voltage level (506-yes), this indicates that the key switch KS_4 is currently activated (508) because the pull-down resistor R3 causes the voltage level at the I/O terminal GPIO_1 to drop to the ground level. In some other embodiments, the logic-low voltage level (506-yes) represents a logic-low input signal from the input channel Input_1 if the key switch KS_4 is replaced with the input channel Input_1. The sequencer 400, in response, saves the activated key switch KS_4 or the input signal from Input_1 in one or more registers (509) and then performs the same operations (510, 512, 514, 515) to the other I/O terminal GPIO_2. In other words, the key-scan sequencer 400 can detect two substantially simultaneous key switch activations or input signals.

If the key-scan sequencer 400 does not detect activation of either of the two key switches KS_4, KS_5 or an input signal from either of the two input channels Input_1, Input_2 during the first phase of the key-scan cycle (517-no), the sequencer 400 starts the second phase of the key-scan cycle. Otherwise (517-yes), the sequencer 400 generates one or more events associated with the key switch KS_4 or corresponding input signal (536) and returns to wait for the next key-scan cycle. In some embodiments, other components of the electronic application may be triggered to perform predefined operations by the activated key switch or input signal.

During the second phase of the key-scan cycle, the sequencer 400 applies a logic-low input signal to the I/O terminal GPIO_2 and captures the output signal at the I/O terminal GPIO_1 (516). Depending on which of the three key switches KS_1, KS_2, KS_3 is activated, the output signal can have either a logic-low level (if the key switch KS_1 or KS_3 is activated) or a logic-high level (if the key switch KS_2 is activated or no key switch is activated). In either case, the sequencer 400 can not reach a definitive answer as to which of the three key switches is activated. The sequencer 400 applies a logic-low input signal to the I/O terminal GPIO_1 and captures the output signal at the I/O terminal GPIO_2 (518). The operations 516 and 518 are essentially the same except that the current flows of the two operations are in opposite directions. For operation 516, the current flow, if existing, is from GPIO_1 to GPIO_2. But for operation 518, the current flow, if existing, is from GPIO_2 to GPIO_1.

From the outcomes of the two operations 516 and 518, the sequencer 400 determines which of the three key switches, if any, is activated. For example, when both I/O terminals have a logic-low voltage level at the two operations (520), the process determines that the key switch KS_3 is activated (522) because the signal path including the key switch KS_3 is bi-directional and it allows current flow in either direction. When the I/O terminal GPIO_1 has a logic-high level at the operation 516 and the I/O terminal GPIO_2 has a logic-low level at the operation 518 (524), the process determines that the key switch KS_2 is activated (526) because it only allows current flow from GPIO_2 to GPIO_1. When the I/O terminal GPIO_1 has a logic-low level at the operation 516 and the I/O terminal GPIO_2 has a logic-high level at the operation 518 (528), the process determines that the key switch KS_1 is activated (530) because it only allows current flow from GPIO_1 to GPIO_2. Finally, when both I/O terminals have a logic-high level at the two operations (532), the process determines that no key switch is activated (534) because there is no current flow during the two operations. Depending on which of the three key switches, if any, is activated, the sequencer 400 generates the corresponding events (536) and returns until the next key-scan cycle starts.

Note that the sequence of operations described above in connection with FIG. 5 is illustrative of a key-scan process. Persons skilled in the art will recognize that there are many other possible operation sequences. For example, the sequencer 400 may perform the second phase and then the first phase or even mix the two phases together as long as it finishes the operations shown in FIG. 5 within a key-scan cycle. In addition, this process can be extended to work with larger arrays of keys.

Generally, for a given number of I/O terminals (n), the number of key switches (N) supported by the prior art approaches and the embodiments of present invention described above can be defined as follows:

Matrix Configuration:
    If n is even, $N=(n/2)*(n/2)$;
    If n is odd, $N=(n+1)*(n-1)/4$;
Pyramid Configuration:
    $N=n*(n+1)/2$;
Present Invention:
    $N=n*(3n-1)/2$;

Below is a table illustrating the significant improvement of the ratio of key switches to I/O terminals by the embodiments of the present invention described above when compared with the prior art approaches.

TABLE 1

Number of Key Switches Supported by Different Approaches

| Number of I/Os (n) | Maximum number of key switches supported (N) | | |
|---|---|---|---|
| | Matrix Configuration | Pyramid Configuration | Present Invention |
| 2 | 1 | 3 | 5 |
| 3 | 2 | 6 | 12 |
| 4 | 4 | 10 | 22 |
| 5 | 6 | 15 | 35 |
| 6 | 9 | 21 | 51 |
| 7 | 12 | 28 | 70 |
| ... | ... | ... | ... |

In some embodiments, there is a regular time interval (e.g., 200 ms) between consecutive key-scan cycles and it takes less than 200 ms for the key-scan sequencer to finish each of the key-scan detection operations. In this case, it is possible to let the key-scan sequencer share the I/O terminals with other components of the electronic application, especially those components that transmit signals at a relatively low frequency.

Figure 6:
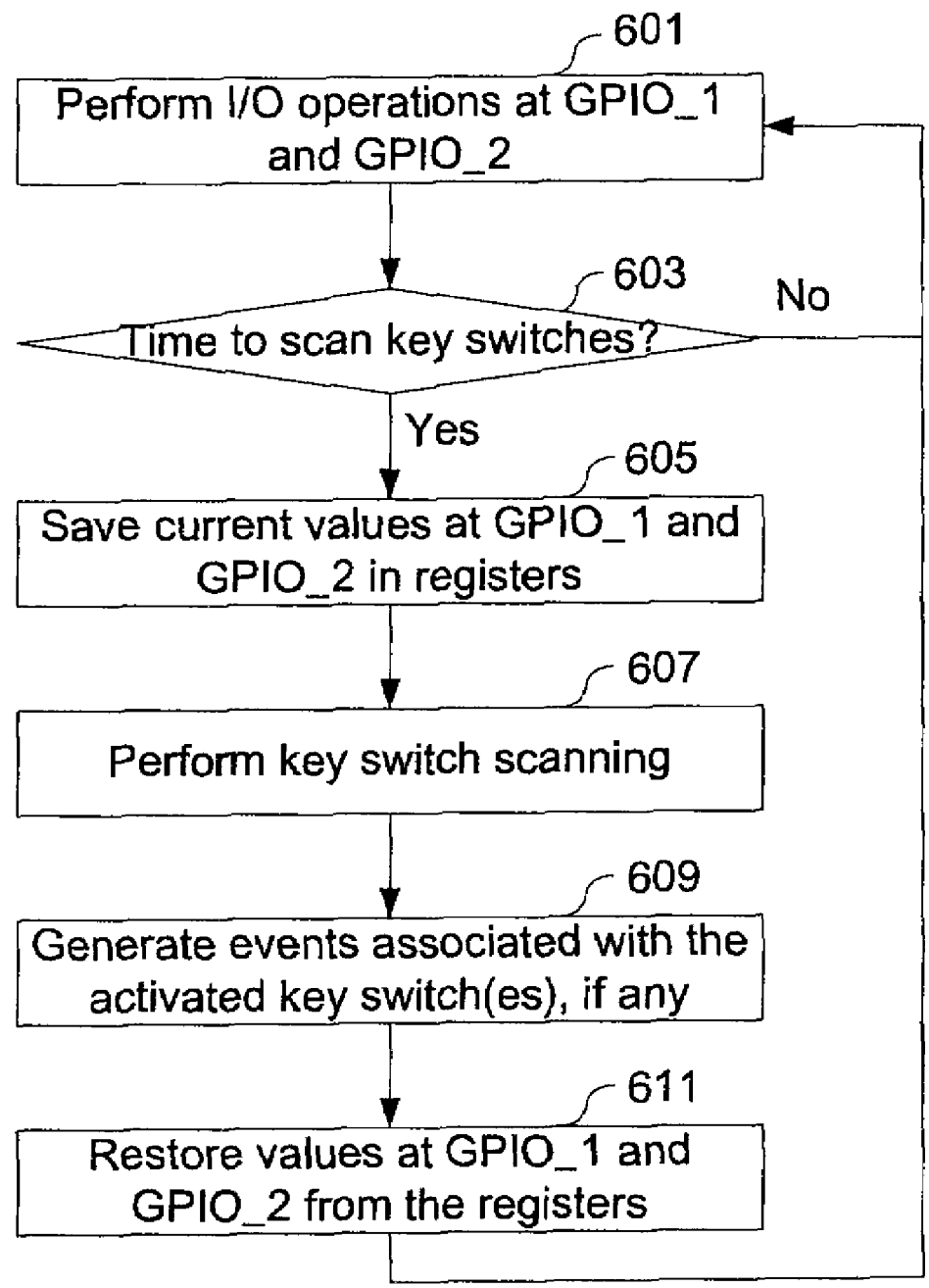
FIG. 6 is a flow chart of an I/O terminal sharing process in accordance with some embodiments.

FIG. 6 is a flow chart of an I/O terminal sharing process in accordance with some embodiments. Referring again to FIG. 4, in addition to being part of the three signal paths, the I/O terminals GPIO_1 and GPIO_2 are used as data input/output terminals. In this case, as shown in FIG. 4, the sequencer 400 may not be able to support the two key switches KS_4 and KS_5 if the sequencer 400 gets input signals from the two input channels Input_1, Input_2.

Initially, the sequencer 400 performs non-key-scan I/O operations at the I/O terminals GPIO_1 and GPIO_2 (601). In response to a timer interrupt for key-scan operations (603-yes), the sequencer 400 temporarily saves the current values at the two I/O terminals into a storage device such as registers, memory locations or the like (605). These values are brought back to continue the non-key-scan I/O operations after the key-scan operations. Next, the sequencer 400 performs key switch scanning operations (607), e.g., as described above in connection with Figures and 5. After the key-scan operation (607) is completed, the sequencer 400 generates events associated with the user-activated key switches (609). The previously-saved values are restored at the I/O terminals GPIO_1 and GPIO_2 (611) to continue the non-key-scan I/O operations.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. For example, the aforementioned systems and methods can be adapted to allow a large number of devices to share a small number of I/O terminals of an electronic module. The embodiments were chosen and described in order to best explain the principles of the invention and its practical applications, to thereby enable others skilled in the art to best utilize the invention and various embodiments with various modifications as are suited to the particular use contemplated.

What is claimed is:

1. An input device, comprising:
first and second input/output (I/O) terminals; and
a plurality of signal paths coupling the first I/O terminal to the second I/O terminal, wherein the plurality of signal paths comprise a first uni-directional signal path including a first device, a second uni-directional signal path including a second device, and a bi-directional signal path including a third device, wherein the first uni-directional signal path is configured to transmit signals from the first I/O terminal to the second I/O terminal and the second uni-directional path is configured to transmit signals from the second I/O terminal to the first I/O terminal.

2. The input device of claim 1, wherein the first uni-directional signal path includes a diode serially-connected to the first device and the first uni-directional signal path is configured to transfer signals from the first I/O terminal to the second I/O terminal in response to a user activation of the first device.

3. The input device of claim 2, wherein the second uni-directional signal path includes a diode serially-connected to the second device and the second uni-directional signal path is configured to transfer signals from the second I/O terminal to the first I/O terminal in response to a user activation of the second device.

4. The input device of claim 3, wherein the bi-directional signal path is configured to transfer respective signals from the first I/O terminal to the second I/O terminal and from the second I/O terminal to the first I/O terminal in response to a user activation of the third device.

5. The input device of claim 4, further comprising:
a sequencer for sequentially applying input signals to the first and second terminals and capturing output signals at the second and first terminals, respectively.

6. The input device of claim 1, further comprising:
a plurality of pull-up resistors, wherein each pull-up resistor is coupled to one of the I/O terminals for pulling the I/O terminal to a logic-high level.

7. The input device of claim 1, further comprising:
a plurality of pull-down resistors, wherein each pull-down resistor is coupled to one of the I/O terminals through a fourth device for pulling the I/O terminal to a logic-low level in response to a user activation of the fourth device.

8. The input device of claim 1, further comprising:
a sequencer for sequentially determining user activations of the first, second, and third devices.

9. The input device of claim 1, wherein at least one of the first, second, and third devices is a key switch.

10. An input device, comprising:
first, second, and third arrays of devices;
multiple input/output (I/O) terminals, including first and second I/O terminals; and
multiple signal paths for coupling the three arrays of devices to the multiple I/O terminals, wherein there are at least three signal paths between the first I/O terminal and the second I/O terminal, including a first uni-directional signal path including a first device of the first array of devices, a second uni-directional signal path including a second device of the second array of devices, and a bi-directional signal path including a third device of the third array of devices, wherein the first uni-directional signal path is configured to transmit signals from the first I/O terminal to the second I/O terminal and the second uni-directional path is configured to transmit signals from the second I/O terminal to the first I/O terminal.

11. The input device of claim 10, wherein the first uni-directional signal path includes a diode serially-connected to the first device and the first uni-directional signal path is configured to transfer signals from the first I/O terminal to the second I/O terminal in response to a user activation of the first device.

12. The input device of claim 11, wherein the second uni-directional signal path includes a diode serially-connected to the second device and the second uni-directional signal path is configured to transfer signals from the second I/O terminal to the first I/O terminal in response to a user activation of the second device.

13. The input device of claim 12, wherein the bi-directional signal path is configured to transfer respective signals from the first I/O terminal to the second I/O terminal and from the second I/O terminal to the first I/O terminal in response to a user activation of the third device.

14. The input device of claim 13, further comprising:
a sequencer for sequentially applying input signals to the first and second terminals and capturing output signals at the second and first terminals, respectively.

15. The input device of claim 10, further comprising:
a plurality of pull-up resistors, wherein each pull-up resistor is coupled to one of the multiple I/O terminals for pulling the I/O terminal to a logic-high level.

16. The input device of claim 10, further comprising:
a plurality of pull-down resistors, wherein each pull-down resistor is coupled to one of the I/O terminals through a fourth device for pulling the I/O terminal to a logic-low level in response to a user activation of the fourth device.

17. The input device of claim 10, further comprising:
a sequencer for sequentially determining user activations of the first, second, and third devices.

18. The input device of claim 10, wherein at least one of the first, second, and third devices is a key switch.

19. A method of detecting user activations of devices, comprising:
applying a first input signal to a first input/output (I/O) terminal, wherein the first I/O terminal is coupled to a second I/O terminal via a plurality of signal paths and the plurality of signal paths comprises a first uni-directional signal path including a first device, a second uni-directional signal path including a second device, and a bi-directional signal path including a third device, wherein the first uni-directional signal path is configured to transmit signals from the first I/O terminal to the second I/O terminal and the second uni-directional path is configured to transmit signals from the second I/O terminal to the first I/O terminal;
capturing a first output signal at the second I/O terminal in response to the first input signal at the first I/O terminal;
applying a second input signal to the second I/O terminal;
capturing a second output signal at the first I/O terminal in response to the second input signal at the second I/O terminal; and
determining which one of the first, second, and third devices, if any, is activated based on the first and second output signals.

20. The method of claim 19, wherein the first device is activated if the first output signal is logically the same as the first input signal and the second output signal is logically different from the second input signal.

21. The method of claim 19, wherein the second device is activated if the first output signal is logically different from the first input signal and the second output signal is logically the same as the second input signal.

22. The method of claim 19, wherein the third device is activated if the first output signal is logically the same as the first input signal and the second output signal is logically the same as the second input signal.

23. The method of claim 19, wherein at least one of the first and third devices is activated if the first output signal is logically the same as the first input signal.

24. The method of claim 19, wherein at least one of the second and third devices is activated if the second output signal is logically the same as the second input signal.

25. The method of claim 19, wherein both the first input signal and the second input signal have a logic-low level.

26. A method of having multiple devices share a circuit's input/output (I/O) terminals, comprising:
applying first and second input signals to respective first and second I/O terminals to generate first and second output signals at the second and first I/O terminals, respectively, wherein the first and second I/O terminals are coupled to first, second, and third devices via a plurality of signal paths; and
determining which, if any, of the first, second, and third devices is activated based on the first and second output signals.

27. The method of claim 26, wherein the plurality of signal paths includes a first uni-directional signal path coupling the first device to the first and second I/O terminals, a second uni-directional signal path coupling the second device to the first and second I/O terminals, and a bi-directional signal path coupling the third device to the first and second I/O terminals.

28. The method of claim 27, wherein the determining includes determining that the first device is activated if the first output signal is logically the same as the first input signal and the second output signal is logically different from the second input signal.

29. The method of claim 27, wherein the determining includes determining that the second device is activated if the first output signal is logically different from the first input signal and the second output signal is logically the same as the second input signal.

30. The method of claim 27, wherein the determining includes determining that the third device is activated if the first output signal is logically the same as the first input signal and the second output signal is logically the same as the second input signal.

31. The method of claim 27, wherein the determining includes determining that at least one of the first and third devices is activated if the first output signal is logically the same as the first input signal.

32. The method of claim 27, wherein the determining includes determining that at least one of the second and third devices is activated if the second output signal is logically the same as the second input signal.

33. The method of claim 26, wherein both the first input signal and the second input signal have a logic-low level.

* * * * *